United States Patent
Jojiki

(10) Patent No.: US 6,398,872 B1
(45) Date of Patent: Jun. 4, 2002

(54) CIRCUIT FORMING APPARATUS OF SEMICONDUCTOR DEVICE

(75) Inventor: Masao Jojiki, Saitama (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/345,982

(22) Filed: Jul. 1, 1999

(30) Foreign Application Priority Data

Jul. 1, 1998 (JP) .......................................... 10-186024

(51) Int. Cl.[7] .......................... C23C 16/00; H01L 21/27
(52) U.S. Cl. ......................... 118/718; 430/296; 216/66; 438/707; 118/719; 118/720
(58) Field of Search .................... 118/718, 719, 118/720; 156/345; 430/296, 312, 313, 394; 216/66; 438/707

(56) References Cited

U.S. PATENT DOCUMENTS

| | | | | |
|---|---|---|---|---|
| 4,451,738 A | * | 5/1984 | Smith | 250/492.2 |
| 4,622,919 A | * | 11/1986 | Suzuki et al. | 118/718 |
| 5,001,764 A | * | 3/1991 | Wood et al. | 382/145 |
| 5,126,529 A | * | 6/1992 | Weiss et al. | 219/121.6 |
| 5,628,828 A | * | 5/1997 | Kawamura et al. | 118/719 |
| 5,745,242 A | * | 4/1998 | Hata | 356/401 |
| 6,023,068 A | * | 2/2000 | Takahashi | 250/492.2 |

FOREIGN PATENT DOCUMENTS

| | | | |
|---|---|---|---|
| JP | 53-114677 A | * | 10/1978 |
| JP | 62-252935 | * | 11/1987 |
| JP | 64-41216 | * | 2/1989 |
| JP | 7-221000 | * | 8/1995 |
| WO | WO 98/25090 | | 6/1998 |

OTHER PUBLICATIONS

Pending U.S. Application 09/348/765, Jokiki "Linear Semiconductor Device" Filed Jul. 7, 1999 (Attorney Docket No. 4295–4).

Pending U.S. Application 09/350/391, Jokiki "Semiconductor Device and Semiconductor Assembly for Semiconductor Device" Filed Jul. 9, 1999 (Attorney Docket No. 4295–5).

* cited by examiner

*Primary Examiner*—Gregory Mills
*Assistant Examiner*—Sylvia R. MacArthur
(74) *Attorney, Agent, or Firm*—Pitney, Hardin, Kipp & Szuch LLP

(57) ABSTRACT

A linear semiconductor material having a thin metal-oxide layer and a resist layer is conveyed at a constant speed by rotating rollers. An electron-beam drawing apparatus, in which micro-electron-guns are aligned circumferentially, is disposed between the rollers. The linear semiconductor material passes through a cylindrical hole of the electron-beam drawing apparatus such that a circuit pattern is formed on a surface of the linear semiconductor material by an electron beam. The linear semiconductor material is developed and etched, and divided into predetermined lengths. Thus a linear semiconductor is completed. A semiconductor device is manufactured by bundling a plurality of the linear semiconductors of predetermined length.

9 Claims, 8 Drawing Sheets

CIRCUIT FORMING APPARATUS OF SEMICONDUCTOR DEVICE

BACKGROUND OF THE INVENTION

1. Field of the Invention

The present invention relates to a circuit forming apparatus of a semiconductor device.

2. Description of the Related Art

In the conventional semiconductor devices, circuits are formed on a flat silicon wafer. In order to decrease manufacturing expense, a large diameter single silicon crystal column is manufactured through a crystal growth method, which is then divided into a multitude of wafers. The manufacturing apparatus becomes more expensive as the diameter of the single crystal column increases. During manufacture of the conventional semiconductor device, the wafer is conveyed by a belt conveyer, for example, through many manufacturing stages, while being subjected to successive manufacturing processes. The manufacturing process is intermittent, taking several months to completion.

SUMMARY OF THE INVENTION

Therefore, an object of the present invention is to provide a continuous-process circuit forming apparatus of a semiconductor device that has a low manufacturing cost and a short manufacturing time.

A circuit forming apparatus of a semiconductor device according to the present invention handles a linear semiconductor, and comprises a conveyer unit that conveys the linear semiconductor material in the longitudinal direction and a drawing unit that forms a circuit pattern by scanning a beam on a surface of the linear semiconductor.

BRIEF DESCRIPTION OF THE DRAWINGS

The present invention will be better understood from the description of the preferred embodiment of the invention set forth below together with the accompanying drawings, in which.

DESCRIPTION OF THE PREFERRED EMBODIMENTS

Hereinafter, the preferred embodiment of the present invention is described with reference to the attached drawings.

Figure 1:
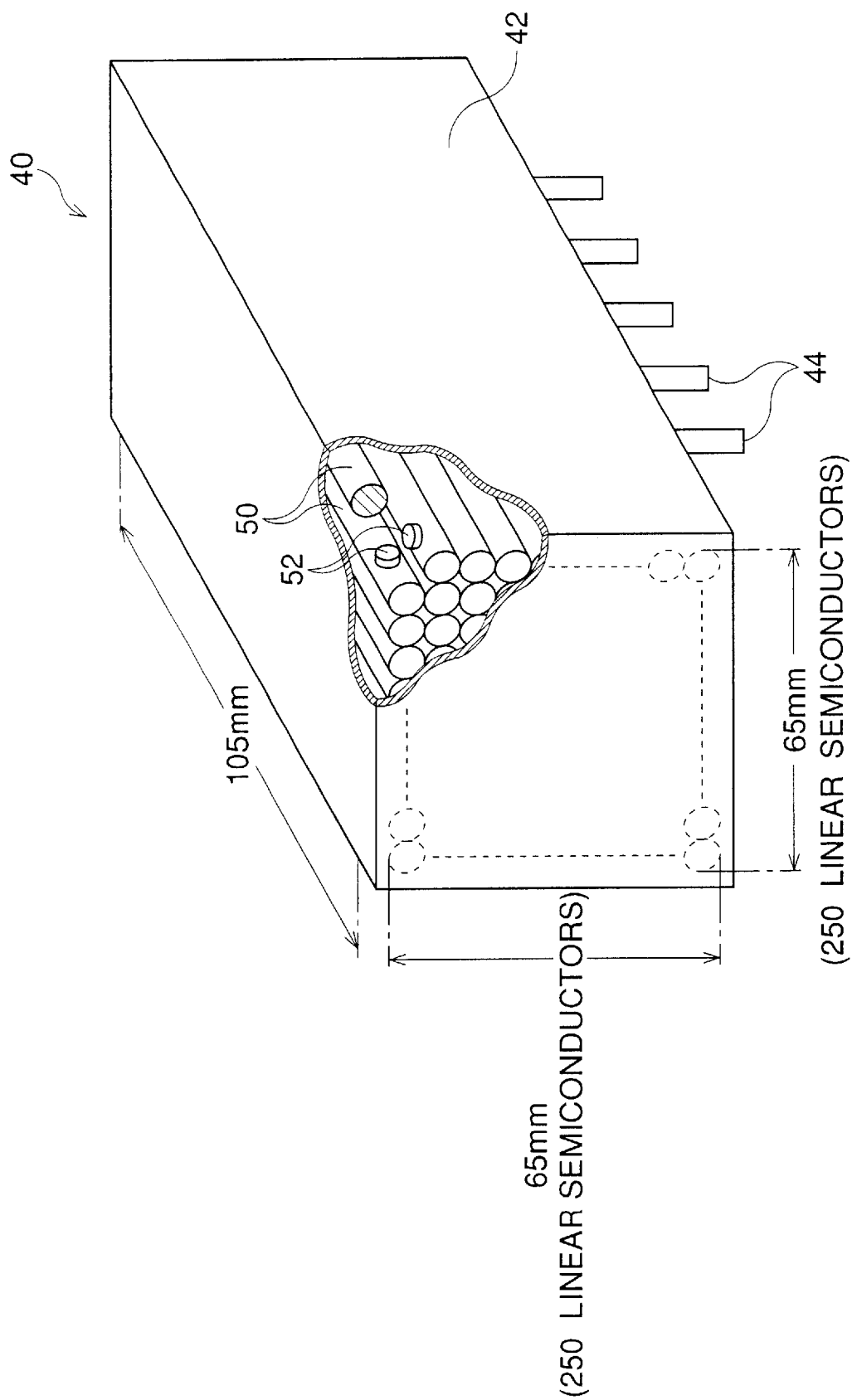
FIG.1 is a perspective view showing a semiconductor device manufactured by an embodiment of a circuit forming apparatus according to the present invention.

FIG. 1 is a perspective view showing a semiconductor device, being a memory device, manufactured by an embodiment of a circuit forming apparatus according to the present invention. The semiconductor device 40 includes a plurality of linear semiconductors 50 which are bundled within a rectangular parallelepiped casing 42. A circuit pattern is formed on a surface of the linear semiconductors 50 by the circuit forming apparatus. A multi-layer construction of a plurality of thin semiconductor layers is formed on each linear semiconductor 50. Electrodes 52 are formed on each of the linear semiconductors 50 for connecting the linear semiconductors 50 with each other. A plurality of input/output terminals 44 are dispose on an outer surface of the casing 42, and are connected to the linear semiconductors 50.

Each of the linear semiconductors 50 has a circular cross-section with a diameter of 260 μm and a length of 105 mm. A rectangular bundle of the linear semiconductors 50 is formed, in which 250 linear semiconductors 50 are aligned horizontally as well as vertically forming a matrix cross-section arrangement. On each linear semiconductor 50, 1024 memory devices are aligned in a circumferential direction and 131072 memory devices are aligned in an axial direction on the surface of each linear semiconductor 50, according to a 0.1 μm rule. One linear semiconductor 50 has a memory capacity of 16 Mbyte, and the semiconductor device 40 comprises a total memory capacity of 1 Tbyte.

Figure 2:
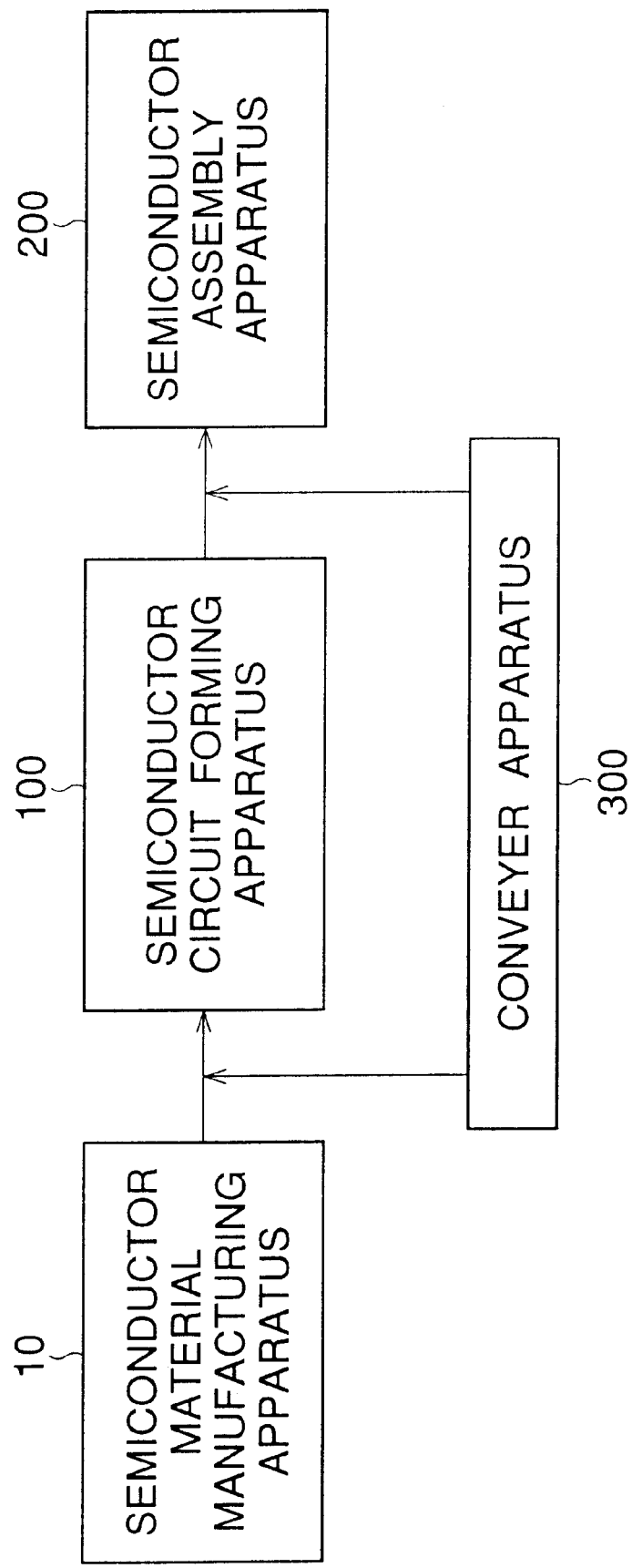
FIG.2 is a block diagram showing a manufacturing process of the embodiment of the circuit forming apparatus.

FIG. 2 is a block diagram showing a manufacturing process of the embodiment of the circuit forming apparatus, for manufacturing the semiconductor device 40. First, a linear semiconductor base filament (reference 31 in FIGS. 5A, 5B, 5C and 5D) is manufactured by a semiconductor material manufacturing apparatus 10, and is conveyed to a circuit forming apparatus 100 by a conveyer apparatus 300. A circuit pattern is formed on a surface of the linear semiconductor base filament (31) in the circuit forming apparatus 100, creating a linear semiconductor material (reference 30 in FIGS. 5A, 5B, 5C and 5D), from which the linear semiconductor 50 is obtained. The linear semiconductors 50 are conveyed to a semiconductor assembly apparatus 200 by the conveyer apparatus 300, which manufactures the semiconductor device 40 in FIG. 1.

Figure 3:
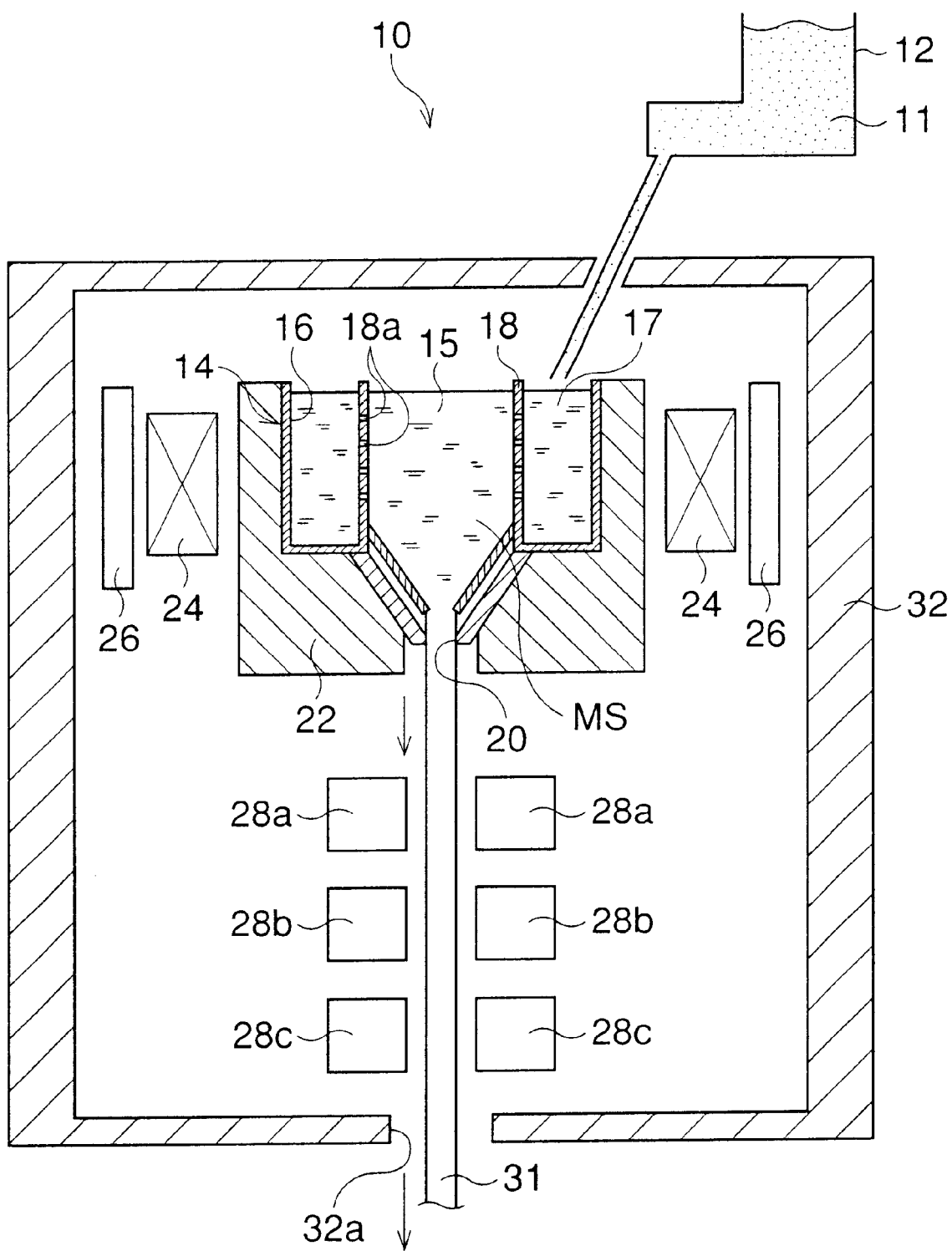
FIG.3 is a cross-sectioned elevational view of a semiconductor material manufacturing apparatus in FIG.2.

FIG.3 is a cross-sectioned elevational view of the semiconductor material manufacturing apparatus 10 in FIG.2. The semiconductor material manufacturing apparatus 10 includes a double crucible 14 for melting a polycrystalline silicon 11. A supplier 12 is disposed higher than the double crucible 14 for supplying, via gravity-feeding, the polycrystalline silicon 11 to the double crucible 14. The double crucible 14 includes a cylindrical central furnace 15, and an annular furnace 17 concentric with and surrounding the central furnace 15. The central furnace 15 and the annular furnace 17 are partitioned by a partition wall 18 and discharge via a common outlet 20 opening downwardly. The annular furnace 17 has an outer wall 16. The double crucible 14 is made of a high purity graphite or quartz. The common outlet 20 has a conical wall funneling to a circular bottom exit hole of 1 mm diameter, such that the molten silicon MS is extruded into a thin linear semiconductor base filament 31. The diameter of the circular hole is adjusted in response to a required diameter of the linear semiconductor base filament 31.

The polycrystalline silicon 11 is fed into the annular furnace 17, and heated until molten at about 1500° C., by an annular electromagnetic coil 24 concentric with and surrounding the double crucible 14, through high frequency heating. The annular electromagnetic coil 24 may be a resistance-type heater, such as a graphite heater. Through holes 18a are disposed in the partition wall 18 through which the molten silicon 11 passes between the central furnace 15 and the annular furnace 17. An annular electromagnet 26, concentric with the double crucible 14 and the electromagnetic coil 24, is disposed surrounding the electromagnetic coil 24, and controls convection of the molten silicon. The double crucible 14 is supported by a support body 22 made of heat-resisting graphite. The molten silicon MS flows downward from the outlet 20 and is gradually cooled. A plurality of heaters 28a,28b and 28c are aligned along a flowing path of the molten silicon MS, heating temperatures of which are set in a decreasing order. Thus, the molten silicon MS is gradually solidified, such that a linear semiconductor base filament 31 of single silicon crystal is formed.

A temperature gradation of the heaters 28a,28b and 28c is adjusted in response to the set diameter of the outlet 20. The electromagnet 26 and the heaters 28a,28b and 28c are controlled by a control apparatus (not shown). The double crucible 14 and heaters 28a to 28c are encapsulated by a heat insulated housing 32. The cooled linear semiconductor base filament 31 exits through a bottom opening 32a and is coiled on a drum (not shown in FIG.3, reference 102 in FIG.4). The linear semiconductor base filament 31, in this embodiment, has a diameter of 260 $\mu$m.

Due to surface tension, a cross-section of the molten silicon MS becomes circular. The diameter of the linear semiconductor base filament 31 of the silicon single crystal is controlled by the diameter of the outlet 20 and the cooling by the heaters 28a, 28b and 28c. The molten silicon MS is cooled from the outer surface, and crystal defects are compressed by the solidifying pressure, separating out to the outer surface. The crystal defects are removed by a removing apparatus (not shown), such as an acid processing apparatus.

The linear semiconductor base filament 31 is coiled on the supply drum 102 (FIG. 4) and supplied by the conveyer apparatus 300 to the semiconductor circuit forming apparatus 100 (FIG. 2).

Figure 4:
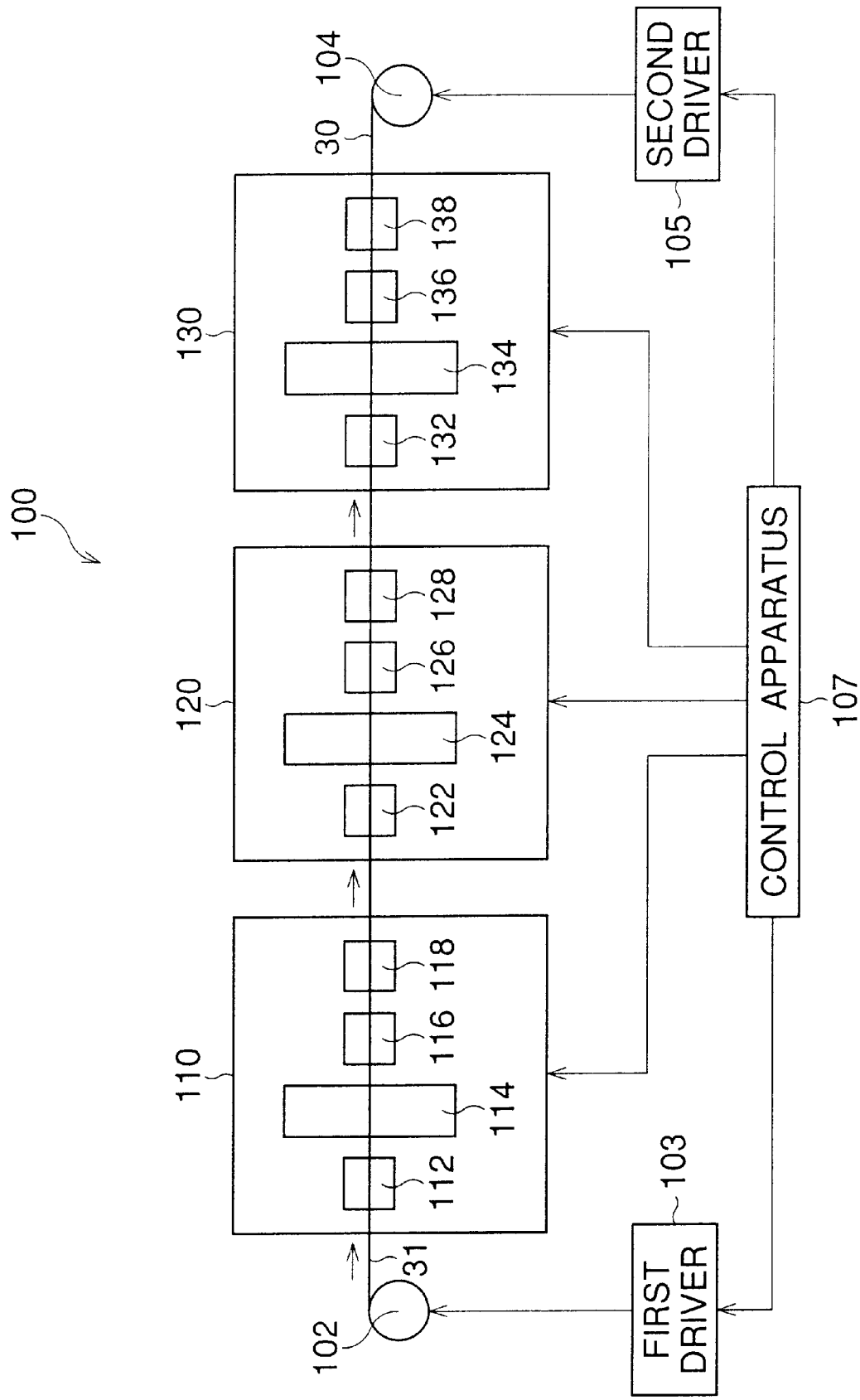
FIG.4 is a generic block diagram showing the embodiment of the circuit forming apparatus.

FIG. 4 is a generic block diagram showing the embodiment of the circuit forming apparatus. The semiconductor circuit forming apparatus 100 includes a supply drum 102 and a coiling drum 104 driven by first and second drivers 103 and 105, respectively. An oxide layer (reference 33 in FIGS. 5A, 5B, 5C and 5D) is coated on the outer surface of the linear semiconductor base filament 31, and the oxide layer (33) is coated over with a nitride layer (reference 35 in FIGS. 5A, 5B, 5C and 5D). The linear semiconductor base filament 31 is wound off the supply drum 102 and supplied to the semiconductor circuit forming apparatus 100. The circuit pattern is formed on the linear semiconductor base filament 31, generating a linear semiconductor material 30, and the linear semiconductor material 30 is taken up by the coiling drum 104.

In the semiconductor circuit forming apparatus 100, "n" (n: integer) number of circuit patterns are formed by repeating the circuit pattern forming process "n" times, using a resist layer (layer 37 in FIGS. 5A, 5B and 5C) and a scan beam for drawing a circuit pattern on the resist layer (37). "n" circuit pattern forming apparatuses 110 to 130 (only three are shown for ease of understanding) are aligned along a conveyer path of the linear semiconductor base filament 31. The circuit pattern forming apparatuses (110 to 130) are controlled by a control apparatus 107. In one of the circuit pattern forming apparatuses (110 to 130), a resist layer forming process, a drawing process, an etching process, a build-up growing process and so forth are performed, enabling a circuit of one circuit pattern to be formed on the outer surface.

Next, the first circuit pattern forming apparatus 110 is described. The first circuit pattern forming apparatus 110 includes a resist layer forming portion 112, a drawing portion 114, an etching portion 116 and a post-process portion 118, in this order from the supply drum 102.

Figure 5A:
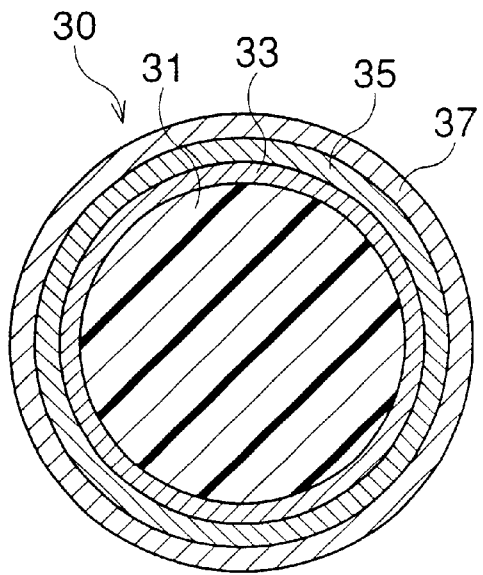
FIG.5A is a cross-sectional view showing a linear semiconductor filament on which a resist layer is formed.
Figure 5B:
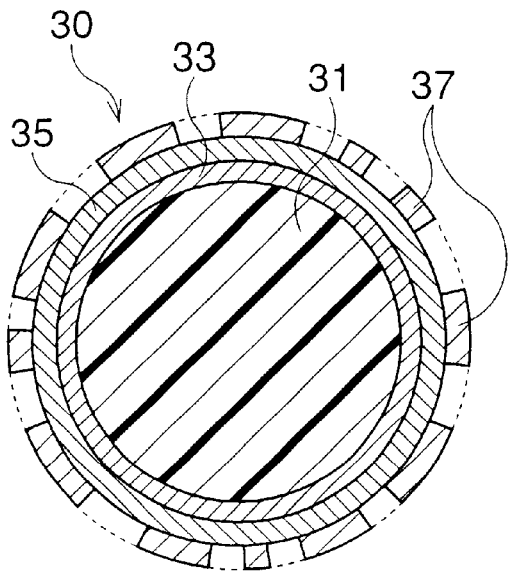
FIG.5B is a cross-sectional view showing the linear semiconductor filament after a drawing process.
Figure 5C:
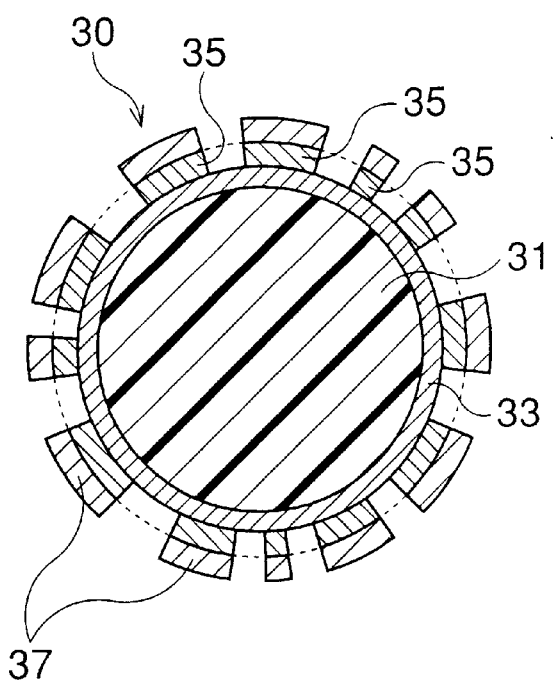
FIG.5C is a cross-sectional view showing the linear semiconductor filament after an etching process.
Figure 5D:
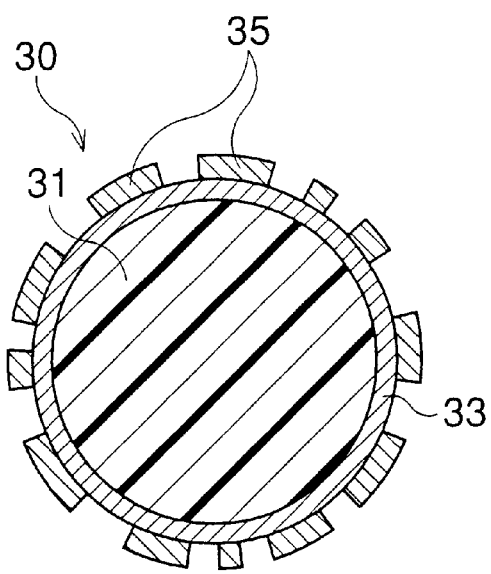
FIG.5D is a cross-sectional view showing the linear semiconductor filament after the resist layer is removed.

FIGS. 5A through 5D are cross-sectional views of the linear semiconductor material 30 after successive processes. In the figures, the circuit pattern is exaggeratedly enlarged by 300 times relative to other portions. Since 1024 transistors are formed in the circumferential direction on a practical linear semiconductor, representing the circuit pattern in reality is difficult. In FIG. 5A, the resist layer 37 is formed on the linear semiconductor base filament 31 by the resist layer forming portion 112 creating the linear semiconductor material 30. In FIG. 5B, the linear semiconductor material 30 is shown after undergoing a drawing process by the drawing portion 114. FIG. 5C shows the linear semiconductor material 30 after an etching process by the etching portion 118. In FIG. 5D, the linear semiconductor material 30 is shown from which the resist layer 37 has been removed by the etching portion 116 through plasma ashing.

A linear semiconductor base filament 31 is a P-type impurity semiconductor, or an intrinsic semiconductor on which a P-type semiconductor is formed by epitaxial growth. The linear semiconductor base filament 31 is coated by the oxide layer 33, and the oxide layer 33 is coated by the nitride layer 35, prior to the first pattern forming process by the first pattern forming apparatus 110. The nitride layer 35 is formed by a CVD process.

In the resist layer forming portion 112, a liquid photoresist is applied to the linear semiconductor material 30, and is thermally dried. Thus, the resist layer 37 (FIGS. 5A, 5B and 5C) is formed as a protective layer against the etching. For the resist layer forming, the well-known conventional spin-coat method is not used, but a method is used by which the linear semiconductor base filament 31 is passed through a cylinder on an inner surface of which spiral grooves are formed. A vortex of a resist mixture fluid is generated in the cylinder, coating the linear semiconductor base filament 31.

In the drawing portion 114, the semiconductor material 30 coated with a resist layer 37 is exposed by an electron beam according to the first circuit pattern and developed. Thus not etched portion of the resist layer 37 is remained (FIG.5b). The drawing portion 114 is described later.

In the etching portion 116, an acid etching liquid is blown against the linear semiconductor base filament 31 to remove an exposed nitride layer 35, allowing the circuit pattern to be formed. Next, a channel-stopper, being as a P-type impurity, is formed by ion-shooting boron (B). When the B-ions are shot at a predetermined voltage of 100 KeV, a portion of the ions is intercepted by the resist layer 37 and the nitride layer 35 (FIG. 5C), thus a remaining portion of the B-ions bombard the oxide layer 33 at an area where the resist layer 37 and the nitride layer 35 are removed. Then, the resist layer 37 is removed (FIG. 5D). Since a conventionally well-known method is applied for the etching and resist layer removal, descriptions are omitted.

In the post-processing portion 118, a field oxidation process, a nitride layer etching process, an oxide layer etching process, a gate-oxidation process, a B-ion shooting process and a polysilicon build-up process are performed. Since these processes are well-known, descriptions are omitted.

Different processes are performed in the post-processing portions 118, 128 and 138 in the circuit pattern forming apparatuses 110, 120 and 130, respectively. For example, a source-drain forming process and a phosphorous-glass build-up process are performed in the second post-process portion 128. An aluminum deposition process is performed in the third post-process portion 138.

The linear semiconductor material 30 on which the first thin layer of the first circuit pattern is formed, is transferred to the second circuit pattern forming apparatus 120, such that the second circuit pattern is additionally formed. The circuit pattern forming is repeated "n" times and the total layers of the circuit patterns are successively formed. When the total layers are formed and the linear semiconductor material 30 is coiled on a coiling drum 104, the linear semiconductor material 30 is sectioned into predetermined lengths forming linear semiconductor 50.

The second and the third circuit pattern forming apparatuses 120 and 130 are similar to the first circuit pattern forming apparatus 110, and corresponding components are designated by increasing like references by "10" and by "20" in the portions 128 and 138, respectively. The linear semiconductor material 30 is coiled on the coiling drum 104, and is transferred to the semiconductor assembly apparatus 200 (FIG.2). The linear semiconductor material 30 is divided into predetermined lengths, for example, 105 mm, being the individual linear semiconductors 50. The semiconductor device 40 in FIG. 1 is obtained by aligning and bundling 62500 linear semiconductors 50 of 105 mm length, into a matrix cross-section configuration.

Figure 6:
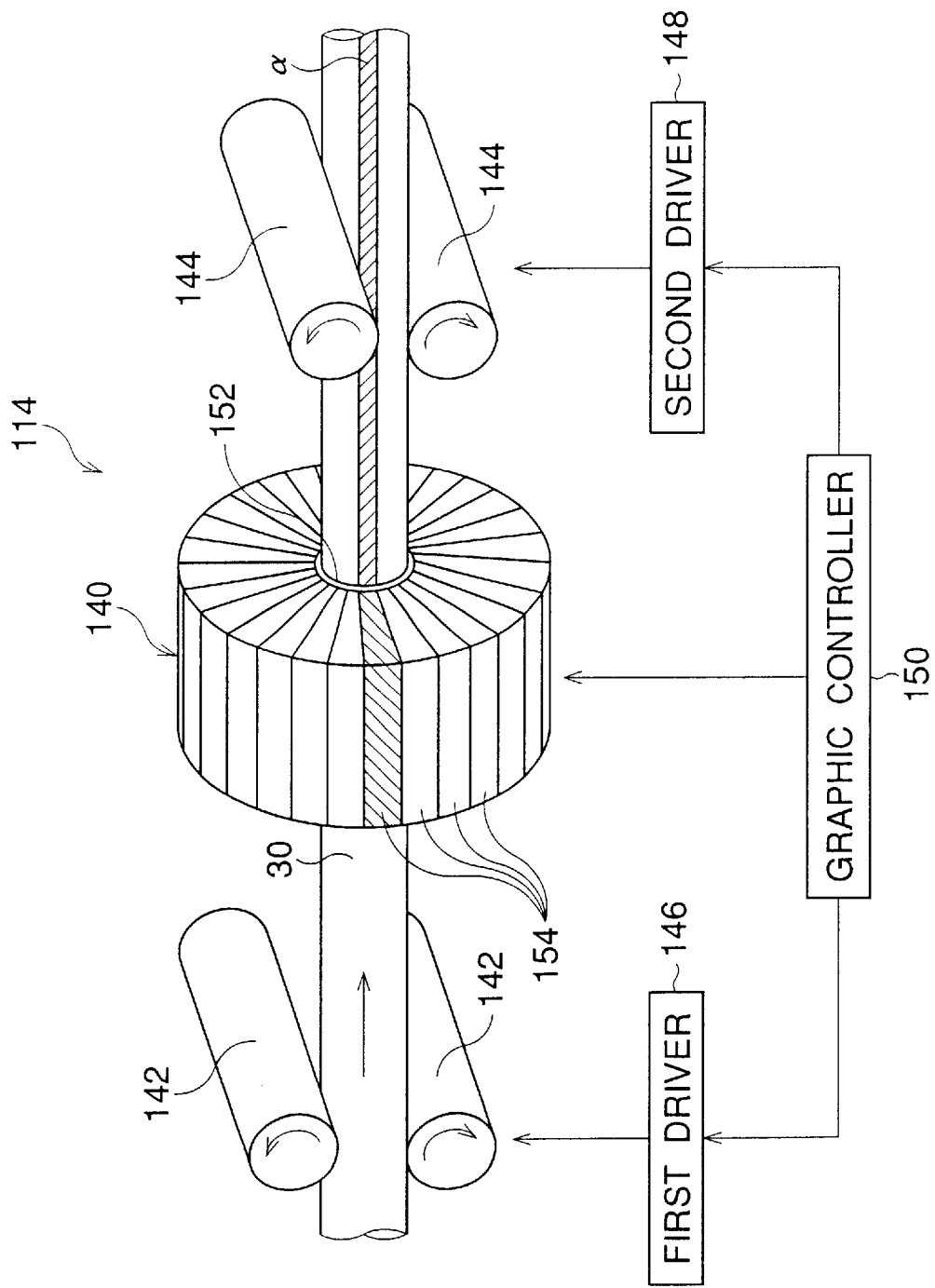
FIG.6 is a perspective view of a drawing unit of a first circuit forming apparatus in FIG.4.
Figure 7:
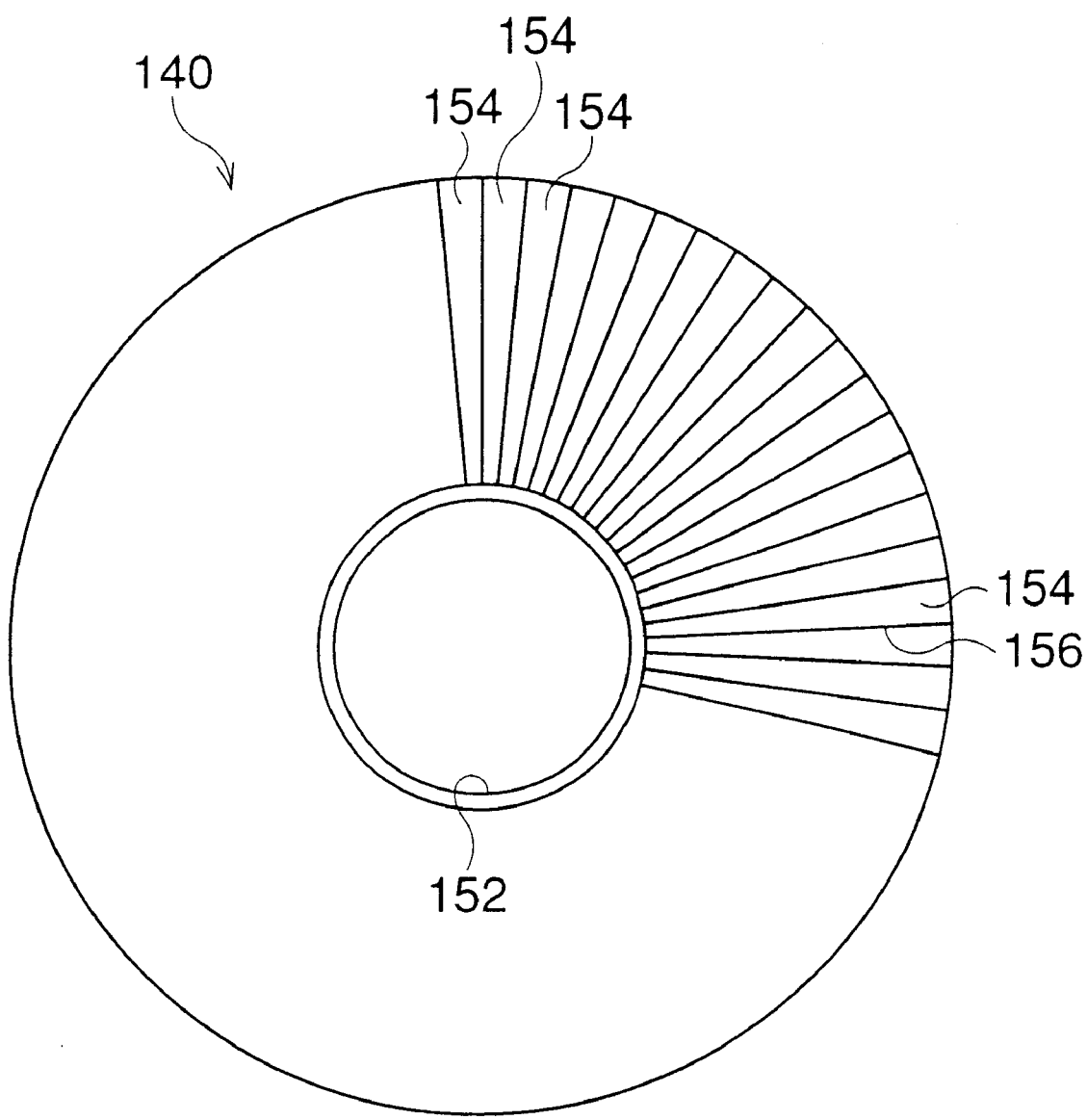
FIG.7 is an elevational view of an electron-beam drawing apparatus of the drawing unit in FIG.6.

A construction and performance of the drawing portion 114 is described with reference to FIGS. 6 to 8. FIG.6 is a perspective view of the drawing portion 114 of the first circuit forming apparatus 100 in FIG. 4. FIG. 7 is an elevational view of an electron-beam drawing apparatus 140 of the drawing portion 114 in FIG. 6. Plural micro-electron guns 154 are disposed in the drawing apparatus 140, however only a portion of them are shown in FIG. 7, for easier of understanding.

The drawing portion 114 includes two pairs of rollers 142 and 144 at axially opposite sides of the electron-beam drawing apparatus 140. The rollers 142 and 144 are driven by drivers 146 and 148, respectively, so as to convey the linear semiconductor material 30 at a constant conveyer speed. The rollers 142 and 144 are shown supporting the linear semiconductor material 30 only in the vertical direction, however, in actuality, a plurality of rollers are disposed for supporting the linear semiconductor material 30 in various directions perpendicular to the axial direction.

The electron-beam drawing apparatus 140 and the drivers 146 and 148 are controlled by a graphic controller 150, which in turn is controlled by the controller 107 (FIG. 4). A raster data corresponding to the first circuit pattern is generated in the graphic controller 150, for controlling an "on" and "off" of the electron-beam. When the electron-beam is "on", the resist layer 37 is irradiated, and when the electron-beam is "off", the resist layer 37 is not exposed.

The drawing performance of the electron-beam drawing apparatus 140 is synchronized with the conveyance by the rollers 142 and 144 driven by the drivers 146 and 148, by the control of the graphic controller 150. The drawing speed and the conveyer speed are determined according to the data processing speed of the circuit pattern.

The electron-beam drawing apparatus 140 has a cylindrical through-hole 152 at a center thereof, through which the linear semiconductor material 30 passes. The first circuit pattern is formed by an electron beam on the linear semiconductor material 30 as the linear semiconductor material 30 passes through the hole 152. A diameter of the hole 152 is bigger than the diameter of the linear semiconductor material 30 by 10 nm to 1000 nm. The diameter of the hole 152 may be mechanically changeable as the linear semiconductor material 30 passes through the hole 152. Another shape of the through hole 152 may be formed in response to a different cross-section of the linear semiconductor material 30.

The electron-beam drawing apparatus 140 includes 64 micro-electron guns 154 aligned in the circumferential direction of the linear semiconductor material 30, each of which radiates electron beam into the through hole 152. 64 areas on the circumferential surface of the linear semiconductor material 30 are irradiated. Each area corresponds to a radial angle $\alpha$ of about 5.6 degrees shown by hatching in FIG. 6.

Figure 8:
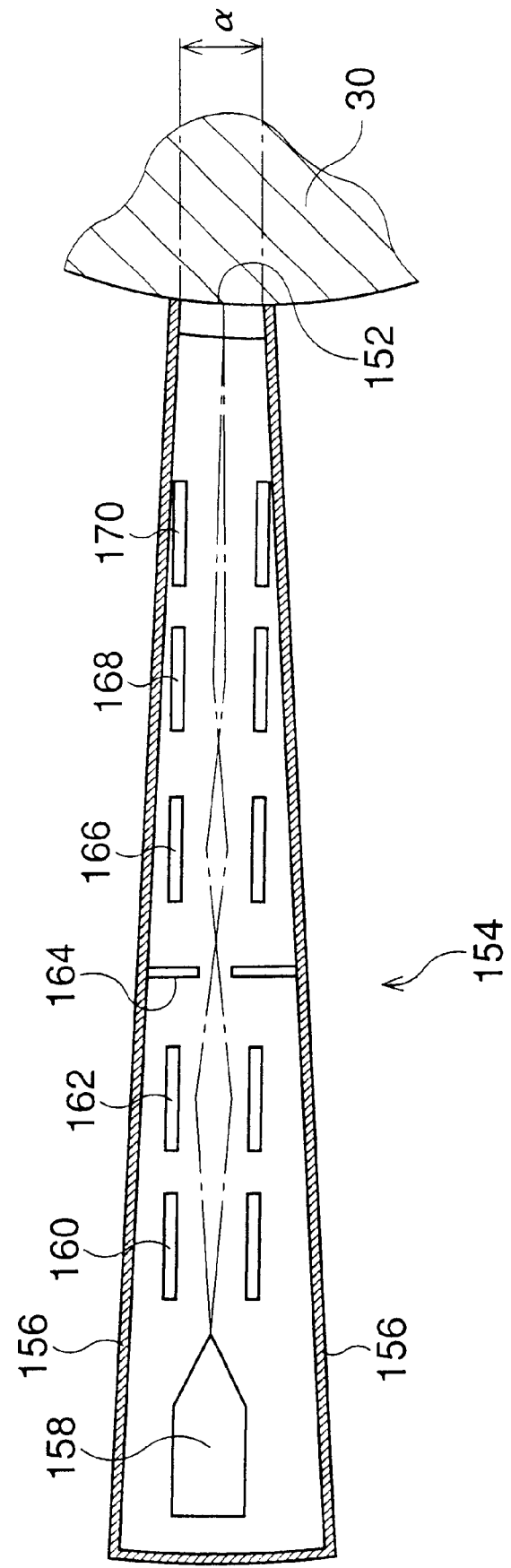
FIG.8 is a cross-sectioned elevational view of a microelectron gun of the electron beam drawing apparatus in FIGS.6 and 7.

FIG. 8 is a cross-sectioned elevational view of a micro-electron gun 154 of the electron beam drawing apparatus 140. A shield wall 156, made of a metal, is disposed between neighboring micro-electron guns 154, and shields adjacent micro-electron guns 154 from generated electric fields. An electronic filament 158 is disposed for generating a heat electron, which is switched "on" or "off" by a switching electrode 160 in response to a graphic data of the first circuit pattern. The electronic filament 158 is made from a carbon nano-tube, for example.

Convergence of the electron beam is caused by electron lenses 162, 166 and 168. A rectangular filter 164 is interposed between the electron lenses 162 and 166, and deforms a cross-section of the electron beam to a rectangle. After the convergence of the electron beam through the electron lenses 162 to 168, the electron beam is conducted to a deflector 170 which deflects and scans the electron beam in the circumferential direction of the linear semiconductor material. The area on the linear semiconductor filament 30, defined by the angle $\alpha$, is scanned by the electron beam.

In the semiconductor circuit forming apparatus 100 of the above embodiment, an effect is achieved that the manufacturing time is decreased, because the circuit pattern is formed as the linear semiconductor material 30 is continuously conveyed at a constant speed, differently from the conventional process in which the conveyance and circuit forming are alternately performed. The electron-beam drawing apparatus 140 may be movable axially between the rollers 142 and 144 to enable touching-up of the circuit pattern on the linear semiconductor material 30. If the electron-beam drawing apparatus 140 is movable in a narrow area between the rollers 142 and 144, the drawing is possible by stopping the conveyance of the linear semiconductor material 30. The conveyer speed may be changeable, when a reference mark is formed at the first circuit pattern forming apparatus 110 and the other circuit pattern forming apparatuses (120, 130) form the circuit patterns based on the relative positioning with respect to the reference mark. Further, the circuit patterns are drawn directly by a raster data without using any photo-masks, thus a manufacturing cost is reduced.

In the conventional semiconductor manufacturing apparatus, only one surface of the wafer is available for forming the circuit pattern. In the above embodiment, all of the circumferential surface of the linear semiconductor 50 is available for forming the circuit pattern, thus a far greater percentage area is utilized. The semiconductor device becomes smaller, when compared with a conventional semiconductor device of the same capability, and the process speed is improved due to a decrease in delay time in the smaller semiconductor device.

A large scale manufacturing apparatus is necessary for large size silicon of about 200 mm in diameter for the conventional semiconductor device, while the semiconductor base filament manufacturing apparatus of the above embodiment handles semiconductors of not more than 5 mm in diameter, and is much smaller in size than the conventional apparatus. The process speed of the manufacturing becomes higher than the conventional apparatus. The manufacturing cost and manufacturing time are decreased due to continuous process, and not an intermittent pattern as in the conventional device.

In the conventional liquid phase epitaxial process, wafers are aligned in a furnace and a silicon solvent is injected, while, in the embodiment above, the linear semiconductor base filament 31 is passed through a container of silicon solvent. Thus, the manufacturing process becomes simpler, and the manufacturing time becomes shorter.

Other scan beams, such as a laser beam or an ion-beam, other than the electron-beam of the above embodiment can be used. Differently from the above embodiment, the laser-beam is scanned by a mirror or other reflecting unit.

When a laser beam of an excimer laser is used, an abrasion method may be applied for forming the circuit pattern by using a polyethylene organic layer. A laser diode may be utilized if the linear semiconductor 50 is low in circuit density.

When the ion-beam is used, an ion beam generated from an ion source of argon, beryllium, or silicon, for example, is radiated through an ion convergent lens and a deflector onto the linear semiconductor material 30. In this case, a polymer-type organic resist is used as a resist layer (37) and development is performed by oxygen-dry-etching. Polymethylmethacrylate (PMMA) of a negative resist or polychloromethylstyrene of a positive resist may be used.

The diameter of the linear semiconductor base filament 31 is not limited to 260μm, as in the above embodiment. Providing the linear semiconductor base filament 31 is uniformly stressed under a pressure and a heating of as short a time as possible, any diameter may be applicable, although, a diameter of not more than 5 mm is applicable.

Finally, it will be understood by those skilled in the art that the foregoing description is of preferred embodiments of the device, and that various changes and modifications may be made to the present invention without departing from the spirit and scope thereof.

The present disclosure relates to subject matters contained in Japanese Patent Application No. 10-186024 (filed on Jul. 1, 1998) which is expressly incorporated herein, by reference, in its entirety.

What is claimed is:

1. A circuit forming apparatus that forms a circuit pattern on a surface of a linear semiconductor material comprising:
    a conveyor apparatus that conveys said linear semiconductor material in a longitudinal direction along a conveyor path; and
    a drawing unit that draws said circuit pattern on said surface of said linear semiconductor material by scanning a beam on said surface while the linear semiconductor material is conveyed by the conveyor apparatus, wherein said drawing unit disposes a plurality of beam radiation units around said linear semiconductor material, a first beam injection unit ejects a beam in a radial direction to be incident on a portion of said surface, a second beam ejection unit ejects a beam in a radial direction to be incident on a different portion of said surface.

2. The circuit forming apparatus of claim 1, wherein said beam is an electron beam, and said drawing unit draws said circuit pattern on said surface of said linear semiconductor material by scanning said electron beam on said surface.

3. The circuit forming apparatus of claim 1, wherein said beam is a laser beam, and said drawing unit draws said circuit pattern on said surface of said linear semiconductor material by scanning said laser beam on said surface.

4. The circuit forming apparatus of claim 1, wherein said beam is an ion beam, and said drawing unit draws said circuit pattern on said surface of said linear semiconductor material by scanning said ion beam on said surface.

5. The circuit forming apparatus of claim 1, wherein said ejection units are curvilinearly aligned in a circumferential direction of said linear semiconductor material.

6. The circuit forming apparatus of claim 1, wherein a cross-section of said linear semiconductor material is circular.

7. The circuit forming apparatus of claim 1, wherein said conveyer apparatus conveys said linear semiconductor material at a constant speed.

8. The circuit forming apparatus of claim 1, further comprising:
    a semiconductor layer forming unit disposed beside said conveyer path of said conveyer apparatus, that forms a thin semiconductor layer on a surface of a base filament of said linear semiconductor material;
    a resist layer forming unit disposed beside said conveyer path of said conveyer apparatus after said semiconductor layer forming unit, that forms a resist layer against etching on said thin semiconductor layer;
    a drawing unit disposed beside said conveyer path of said conveyer apparatus after said resist layer forming unit, that selectively removes said resist layer by scanning a beam according to said circuit pattern;
    an etching unit disposed beside said conveyer path of said conveyer apparatus after said drawing unit, that selectively removes said thin semiconductor layer where said resist layer is removed by said drawing unit; and
    a resist layer removing unit disposed beside said conveyer path of said conveyer apparatus after said etching unit, that removes said resist layer remaining on said semiconductor layer.

9. The circuit forming apparatus of claim 8, wherein said conveyer apparatus comprises:
    a supply drum disposed on said conveyer path upstream of said semiconductor layer forming unit, that holds and supplies said linear semiconductor base filament to said conveyer apparatus; and
    a coiling drum disposed on said conveyer path downstream of said resist layer removing unit, that takes-up said linear semiconductor base filament supplied from said supply drum,
    whereby said linear semiconductor base filament is continuously supplied along said conveyer path.

* * * * *